(12) United States Patent
Drumm et al.

(10) Patent No.: US 6,322,937 B1
(45) Date of Patent: *Nov. 27, 2001

(54) METHOD FOR CREATING A COLOR FILTER LAYER ON A FIELD EMISSION DISPLAY SCREEN STRUCTURE

(75) Inventors: Paul M. Drumm; Bob L. Mackey, both of San Jose, CA (US)

(73) Assignee: Candescent Technologies Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/364,763

(22) Filed: Jul. 30, 1999

Related U.S. Application Data

(63) Continuation-in-part of application No. 08/807,440, filed on Feb. 28, 1997, now Pat. No. 6,025,097.

(51) Int. Cl.[7] .................................................. G02B 5/20
(52) U.S. Cl. .................................. 430/7; 430/321; 445/24
(58) Field of Search .................................. 430/7, 27, 321; 313/495, 496, 112; 445/24; 427/68

(56) References Cited

U.S. PATENT DOCUMENTS

| | | | |
|---|---|---|---|
| 4,392,077 | * 7/1983 | Libman | 313/474 |
| 5,212,575 | * 5/1993 | Kojima et al. | 359/82 |
| 5,559,397 | * 9/1996 | Tsuruoka et al. | 313/496 |
| 6,025,097 | * 2/2000 | Drumm | 430/7 |

FOREIGN PATENT DOCUMENTS

| | | |
|---|---|---|
| 1-080905 | * 3/1989 | (JP) . |
| 9-054209 | * 2/1997 | (JP) . |

* cited by examiner

*Primary Examiner*—John A. McPherson
(74) *Attorney, Agent, or Firm*—Wagner Murabito & Hao LLP

(57) ABSTRACT

A method for creating a color filter on a display screen that allows better and more efficient adhesion of color pigment crystals to the screen display structure. In one embodiment, the present invention creates a color filter on a glass substrate having a pixel-defining structure. The present embodiment first creates a color filter material by mixing a potassium silicate solution with a color crystal pigment. The color filter material is then applied onto the interior surface of the display screen. The material is then dried. The dried color filter material is then exposed to a visible light from the exterior side of the display screen. The visible light exposes the color filter material through a photomask and through the display screen. The excess layer of color filter material is then removed, leaving behind a color filter of desired transmission wavelength such that light having similar wavelength are substantially transmitted and light of wavelengths different from said color pigment crystals are substantially filtered out by absorption.

16 Claims, 12 Drawing Sheets

METHOD FOR CREATING A COLOR FILTER LAYER ON A FIELD EMISSION DISPLAY SCREEN STRUCTURE

CROSS REFERENCE TO RELATED APPLICATION

This is a continuation-in-part of U.S. patent application Ser. No. 08/807,440, now U.S. Pat. No. 6,025,097, entitled "A Method for Creating a Color Filter on a Flat Panel Display Screen Structure" by P. Drumm, filed Feb. 28, 1997. To the extent not repeated herein, this application is hereby incorporated by reference.

FIELD OF THE INVENTION

The present claimed invention relates to the field of flat panel displays. More particularly, the present claimed invention relates to the fabrication of a color filter layer on a flat panel display screen structure.

BACKGROUND ART

Flat panel displays have become popular for use in outdoors due in large part to their portability. However, bright lights, and sunlight in particular, have been a persistent source of problem for the flat panel color display screens. Even a modest sunlight may reduce the contrast, or "wash out" a display so as to make it practically unreadable.

Bright lights wash out displays by reflecting off of a display screen. These reflections occur at all wavelengths of the visible light hitting the screen. At the same time, light is being transmitted to the screen for the viewer. This light also has certain wavelengths corresponding to its color. The bright sunlight washes out the displays by obscuring the desired color of light emitted from the display.

Conventional display screens have attempted to address the washing out problem by applying color pigment crystals into a pixel structure on the display screens. These color pigment crystals form a color filter to absorb unwanted light and transmit light of a desired color (i.e. wavelength). Specifically, color pigment crystals have been deposited into the sub-pixels of display screens in various arrangements. The color of the pigment crystals so deposited corresponds to the color of the light assigned to a sub-pixel. The conventional methods then used photolithographic process to cure the color pigment crystals into the pixels on the display. Schematic side sectional views depicting conventional steps used in depositing color pigment crystal on the pixels are shown in Prior Art FIGS. 1A through 1G.

Prior Art FIG. 1A illustrates a top view of a black matrix 102 defining a pixel structure. Black matrix 102 is disposed on the interior surface of a display screen 100, typically comprised of glass. The pixel structure is further divided into sub-pixels, typically shown as 104, of three primary light colors: red (R), green (G), and blue (B).

A side sectional view of display screen 100 with black matrix 102 disposed on it interior surface is depicted in Prior Art FIG. 1B.

Prior Art FIG. 1C illustrates a side sectional view of black matrix 102 disposed on top of display screen 100 with colored phosphors 106 disposed thereon. On the interior surface of display screen 100, plurality of sub-pixels are disposed. Phosphors 106 are first coated with color pigment crystals 104 of red, green, or blue color. Subsequently, phosphors of single color, for example red, are deposited on the display screen with a photomask. The color coated phosphors are then cured into the sub-pixels of corresponding color on the display screen. Finally, the phosphors deposited into sub-pixels of different color are removed. This process repeats until all three colors of phosphors are cured in the pixels.

With reference to Prior Art FIG. 1D, phosphors 106 coated with color pigment crystals are then cured into corresponding pixels on the interior surface by an ultraviolet (UV) light 108 illuminated from the interior side of the display screen 100. During the UV exposure process, a photomask is used to ensure curing of color pigment crystals in desired sub-pixels only. That is, the material must not be cured along the top or the edge of black matrix 102.

However, coating individual phosphor particles with color pigment crystals produces unwanted side effects. The main function of the phosphors is to generate light when a beam of electrons bombard them. With an added coat of color pigment crystals, some electrons of lower kinetic energy may no longer be able to penetrate the added color coating. Moreover, even if the electrons make it through the coated crystals, they may not have sufficient kinetic energy left to enable phosphor particles to generate light. Hence, phosphors do not generate as much light as they would without the coating. Such electron impedance translates directly into reduced brightness of the display screen images. As a result, coated phosphors require higher kinetic energy electron requiring higher voltage emitters. Consequently, coated phosphor methods have not been suitable for a low voltage class of display structures.

With reference to Prior Art FIG. 1E, a side sectional view of another display screen 100 is illustrated. On its interior surface, a black matrix 102, defining a plurality of sub-pixels corresponding to red, green, and blue colors is disposed. Color pigment crystals 104, for example red, are then deposited into the sub-pixels of matching colors with a photomask. The color pigment crystals are then cured into the sub-pixels of corresponding color on the display screen. Finally, the color pigment crystals deposited into sub-pixels of different color are removed. This process repeats until all three colors of pigment crystals are cured in the pixels.

As illustrated in Prior Art FIG. 1F, the color crystal pigments 104 are then cured into the pixels on the interior surface by UV light 108 illuminated from the interior side of the display screen 100. Phosphors are then deposited into the sub-pixels on top of the color crystal pigments by a well known photolithographic process. During the UV exposure process, a photomask is used to ensure curing of color pigment crystals in desired sub-pixels only. That is, the material must not be cured along the top or the edge of black matrix 102.

Consequently, conventional methods of curing color pigment crystals require precision in mask alignment and thus are error prone. For example, a slight misalignment of a photomask leads to curing of color pigment crystals in unwanted areas such as along the top or the edge black matrix 102. Prior Art FIG. 1F illustrates portions 109 of color pigment crystals 104 on top of black matrix 102, which should not be cured.

Those skilled in the art will no doubt appreciate that a good adhesion of the color pigment crystals to the surface of a display screen is important for reducing reflection of unwanted lights and increasing transmission of phosphor lights. That is, a tightly bound interface is far more efficient than a poorly-bound interface surface in reflecting and transmitting light. Without a satisfactory adhesion of the color pigment crystals to display screens, reflectivity and transmission properties of a display screen may be adversely affected.

Unfortunately, under the conventional method shown in FIG. 1F, the color pigment crystals are often not adequately cured onto display screens due to their intrinsic nanocrystalline properties. For instance, as illustrated in Prior Art FIG. 1G, when color pigment crystals 104 are subjected to a UV light 108, a cross-linking depicted by structure 110 may occur in the crystals at the top of the layer. The color pigment crystals 104 at the top of the color crystal layer bond to each other before the color pigment crystals 104 below can satisfactorily adhere to display screen 100. Hence under conventional methods, a strong adhesion of color pigment crystals 104 to display screen 100 is not easily obtainable.

Furthermore, the cross-linking of color pigment crystals means that the exposure to an UV light must proceed at a relatively slow pace. That is, rapid exposure to UV light enhances the detrimental cross-linking effect at the top of the layer of color pigment crystals.

Thus, a need exists for a method to create a color filter on a display screen which improves readability of display screens by reducing reflection of ambient light and by increasing transmission of phosphor light of desired wavelength without reducing generation of light by phosphors. A further need exists to achieve the above-mentioned color filter in a way that provides a more efficient adhesion of color pigment crystals to the screen display structure while improving precision in curing process.

SUMMARY OF INVENTION

The present invention provides a method for fabricating a color filter on a display screen which improves readability of display screens by reducing reflection of ambient light and by increasing transmission of phosphor light of desired wavelength without reducing generation of light by phosphors. The present invention further provides a method for achieving the above-mentioned color filter in a way that provides a more efficient adhesion of color pigment crystals to the screen display structure while improving precision in curing process.

Specifically, in one embodiment, the present invention creates a color filter on a glass substrate having a pixel-defining structure. The present embodiment first creates a color filter mixture by mixing a non-slurry homogeneous material comprising an organic or inorganic material. The homogeneous material may include a soluble silicate or silicates such as potassium silicate. The color filter material is then applied onto the interior surface of the display screen. The color filter material is then optionally dried. The dried color filter material is then exposed to a light source, such as visible light, from the exterior side of the display screen. The light source exposes the color filter material through a photomask and through the display screen. Any excess layer of color filter material is then removed, leaving behind a cured color filter of desired transmission wavelength. In doing so, light having a similar wavelength is substantially transmitted through the display screen. Similarly, light having a different wavelength than the color pigment crystals is substantially filtered out by absorption.

In an alternative embodiment, a color filter is created on a glass substrate having a pixel structure defining black matrix with sub-pixels of red, green, and blue colors. The color filter in this embodiment is achieved by first creating a color filter material by mixing a potassium silicate solution with an inorganic salt of crystal pigment of red, green, or blue. Each color filter material corresponds to the sub-pixel colors of red, green, and blue. The color filter material is then applied onto the interior surface of the display screen. The material is then dried. The dried color filter material is then exposed to a light from the exterior side of the display screen. The light exposes the color filter material through a photomask and through the display screen. The excess layer of color filter material is then removed, leaving behind a color filter of desired transmission wavelength whereby light of wavelengths different from said color crystal pigment are substantially filtered out by absorption. The above steps are repeated until all three colors crystal pigments have been cured into sub-pixels of corresponding color.

The addition of the inorganic filter material allows the display screen to bake at a temperature high enough to remove organic materials from the display screen. A high temperature bake further prevents outgassing in the display device after the device has been assembled and sealed.

Hence, the present invention provides a method for fabricating a color filter on a display screen which improves readability of display screens by reducing reflection of ambient light and by increasing transmission of phosphor light of desired wavelength without reducing generation of light by phosphors in a way that provides a more efficient adhesion of color pigment crystals to the screen display structure while improving precision in curing process.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

Prior Art

Prior Art

Prior Art

Prior Art

Prior Art

Prior Art

Prior Art

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
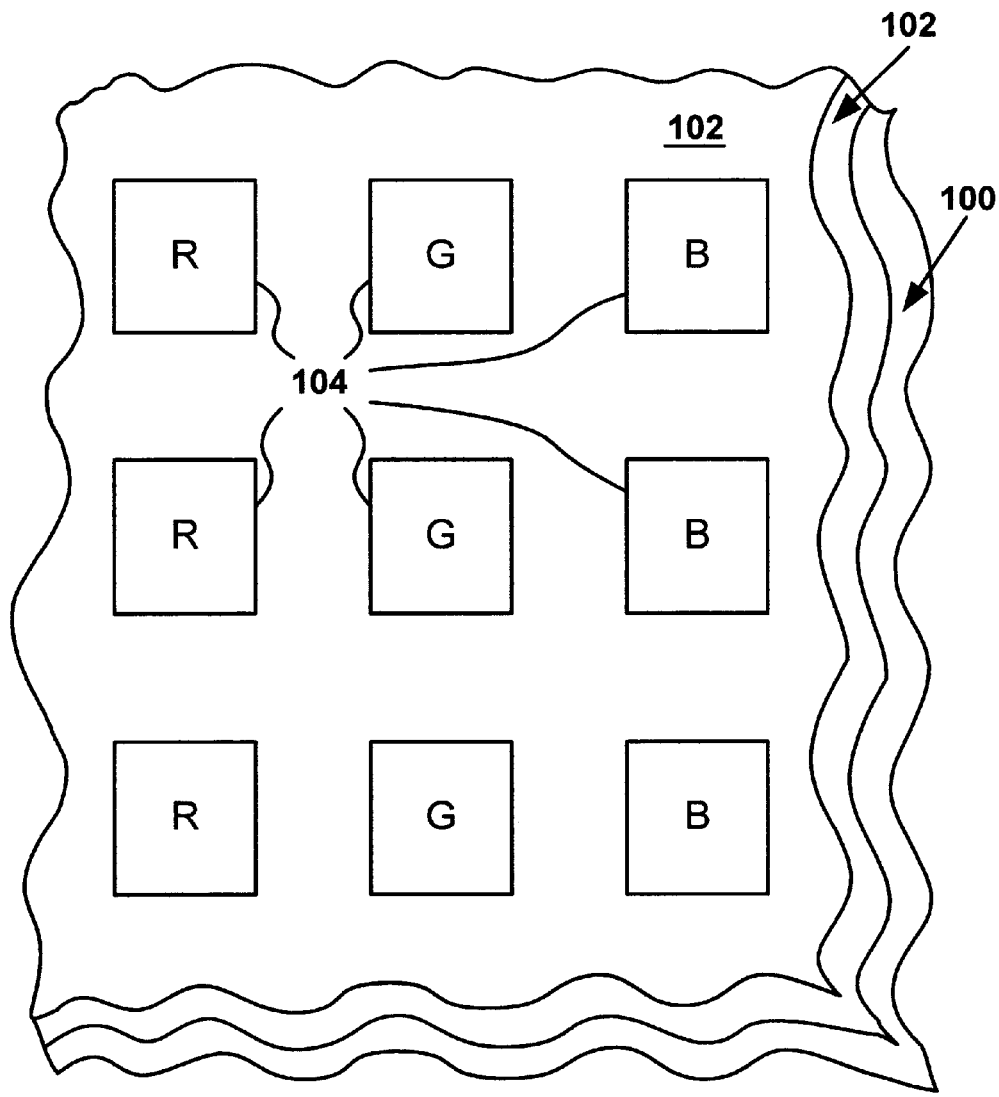
FIG. 1A is a top view of a display screen having a pixel-defining structure.
Figure 1B:
FIG. 1B is a side sectional view of a black matrix defining a pixel structure disposed on a display screen.
Figure 1C:
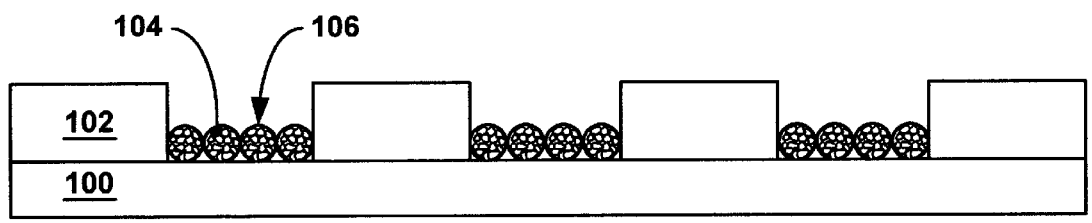
FIG. 1C is a side sectional view of phosphors coated with color pigment crystals disposed within a pixel structure.
Figure 1D:
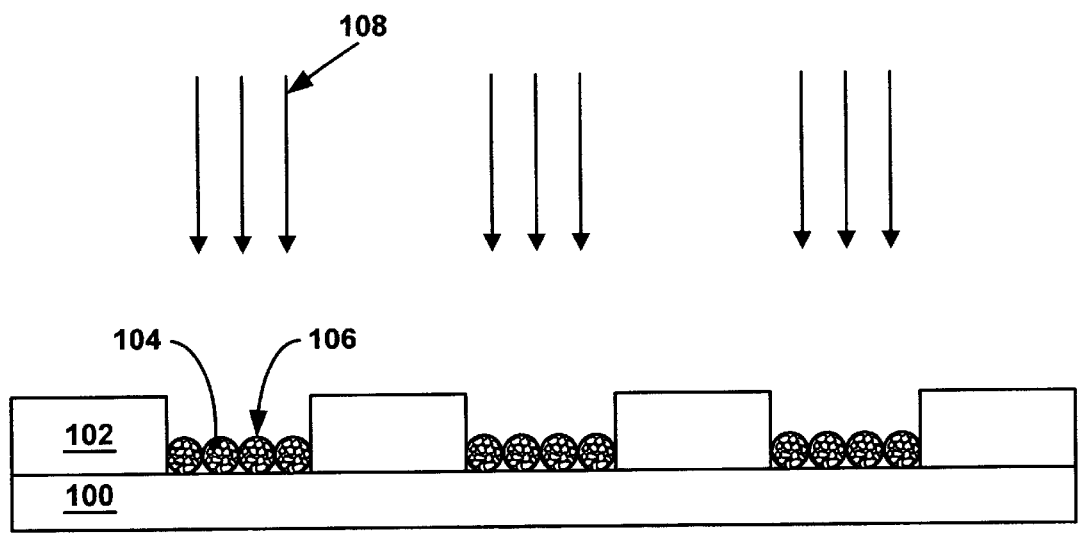
FIG. 1D is a side sectional view of exposure of color pigment crystals coating phosphors within a pixel structure.
Figure 1E:
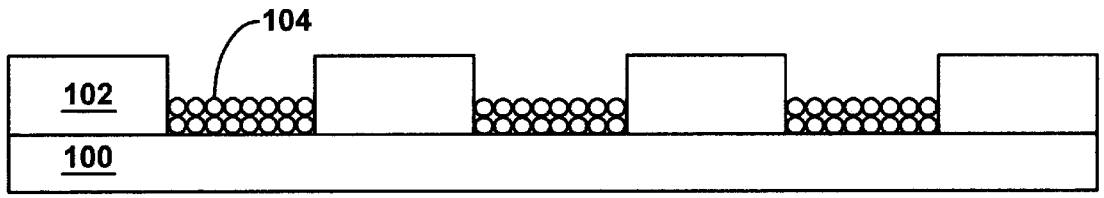
FIG. 1E is a side sectional view of color pigment crystals disposed within a pixel structure.
Figure 1F:
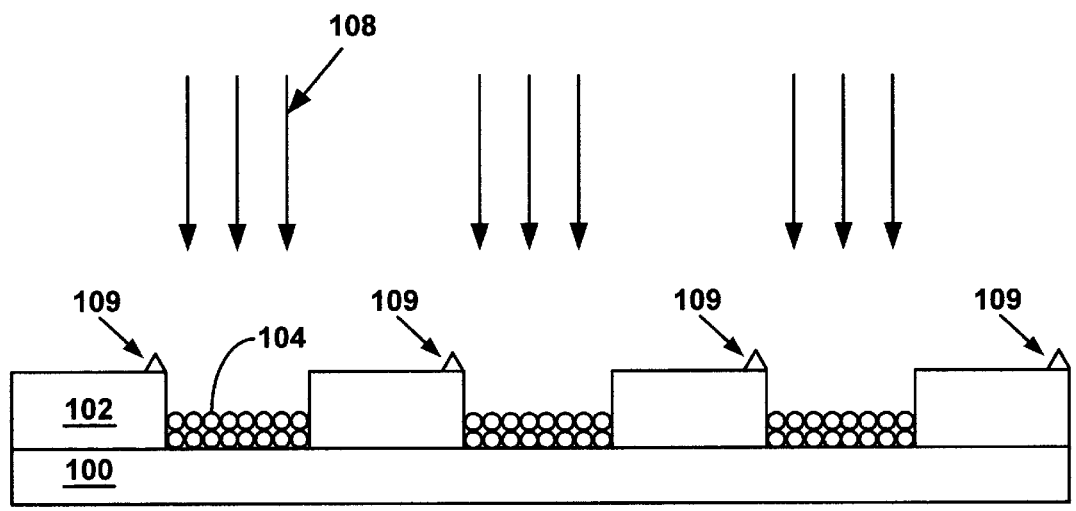
FIG. 1F is a side sectional view of exposure of color pigment crystals within a pixel structure.
Figure 1G:
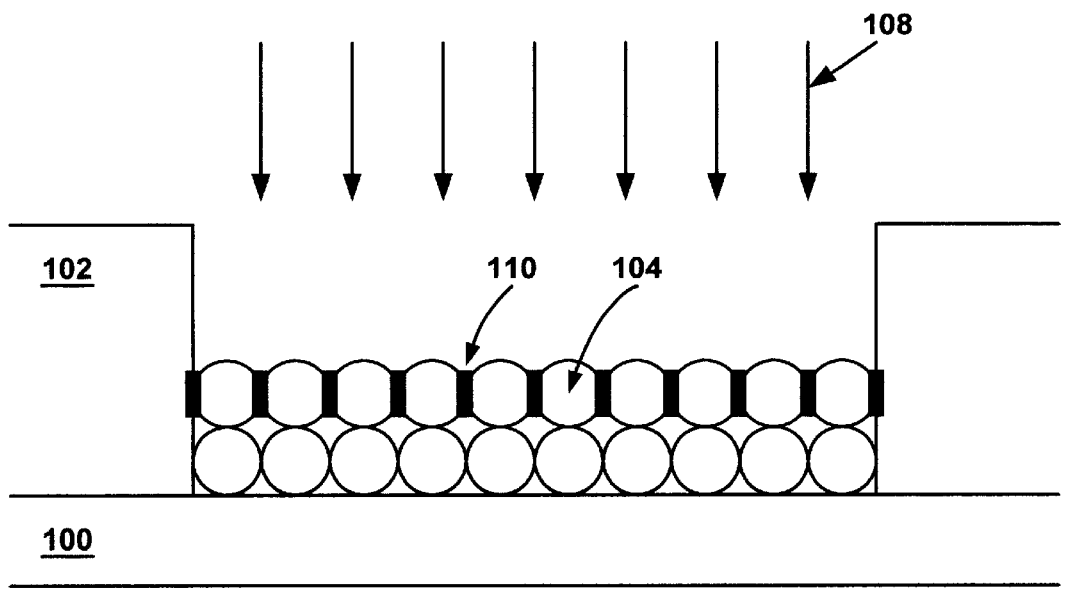
FIG. 1G is an enhanced side sectional view of exposure of color pigment crystals within a pixel structure.
Figure 2A:
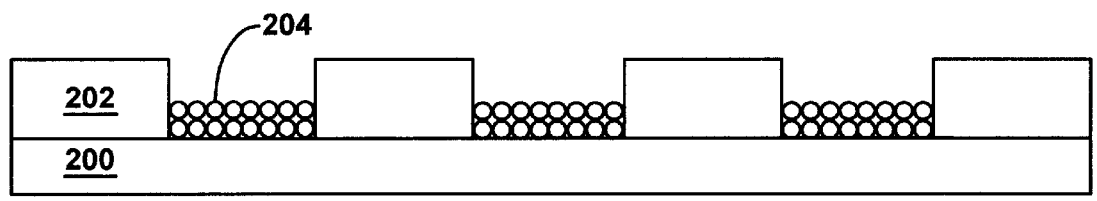
FIG. 2A is a side sectional view of color pigment crystals disposed within a black matrix structure.

With reference to FIG. 2A of the present embodiment, a side sectional view of a glass substrate 200 having a black matrix 202 is illustrated. Use of glass as display screen material is well known in the art. However, those of ordinary skill in the art will appreciate that use of other transparent materials may also be suitable to the present invention.

A black matrix 202 is disposed on the interior surface of a glass substrate 200 and defines a pixel structure on display screen 200. The use of a black matrix in the field of flat panel display structures is well known in the art. However, those skilled in the art will appreciate that use of other pixel-defining structures are also suitable to the present invention.

As shown in FIG. 2A, black matrix 202 of the present embodiment is disposed on the interior side of glass substrate 200. Black matrix 202 comprises walls defining a plurality of wells therein. These wells, in turn, define the pixel structure in the present embodiment.

The present invention creates fine color pigment crystals which will serve as a color filter material. In the present embodiment, these pigment crystals are ball-milled into fine crystals of nanocrystalline size. Ball-milling is a method well known in the art for obtaining nanocrystalline sizes. However, those skilled in the art will appreciate that other methods can be used to obtain fine crystalline sizes.

In the present embodiment, the color pigment crystals are chosen from inorganic salts including cobalt aluminate, iron oxide, and titanium and transition metal oxides. These materials are chosen in the present embodiment because their color filter characteristics correspond to the three primary colors of light: cobalt aluminate for blue, iron oxide for red, and doped titanium oxide for green. Specifically, these color pigment crystals exhibit filter characteristics centered around their characteristic wavelengths. As an example, doped titanium oxide exhibits a characteristic wavelength of green color light. As a result, doped titanium oxide crystals transmit green color light while absorbing light of other colors or wavelengths. Hence, these crystals in effect "filter" out light of unwanted color or wavelength. Although such color pigment crystal materials are used in the present embodiment, the present invention is also well suited for use with various other color materials.

The present invention then mixes the color pigment crystals with organic binders such as potassium silicate solution to create a color filter material. In the present embodiment, the potassium silicate solution comprises 5% by volume of potassium silicate, 0.2 to 5% by weight of salt dichromate such as sodium/potassium dichromate, a surfactant, a dispersant, an emulsifier, tetraethylene glycol, 2.5% by volume salt acetate buffer such as sodium/potassium acetate, and water for the balance. Use of this exemplary potassium silicate solution is well known in the art. However, those skilled in the art will appreciate that potassium silicate solution of differing mixtures is also suitable to the present invention.

The present embodiment then applies a layer of the color filter material onto the interior side of the glass substrate. This color filter material is allowed to settle into the pixels as defined by the wells of black matrix. In one embodiment, color filter materials are applied sequentially, one at a time, from application onto the glass substrate, through visible light exposure, to removal of excess materials. Specifically, in order to form color filters for red, green, and blue pixels, the present embodiment repeats the entire process from beginning to end, for each color. For example, to form a color filter for red pixels, the red color filter material is applied onto the glass substrate. Then, the red color material is cured by visible light. Finally, the red color material in unwanted pixel areas are removed. The entire process repeats until all three color pigment crystals of red, green, and blue have been deposited and cured. In the present embodiment, the color filter material are applied by screen printing or squeegeeing process, which is well known in the art. However, those with ordinary skill in the art will appreciate that other methods of application are also suitable for the present invention.

In another embodiment, the present invention applies all color materials, one color after another before proceeding to the next step. For example, a red color material is applied. Then, a green color material is deposited. Finally, a blue color material is applied. Then, all three color materials are cured onto the pixel areas at the same time. The present embodiment uses a photomask to mask unwanted pixel areas. Then all color filter materials are spray printed one by one using a separate photomask for each color. Hence, all color filter materials will be deposited into respective pixels of corresponding colors. Spray printing and photomasking are well known in the art. Those with ordinary skill in the art, however, will appreciate that other methods of applying and masking are also suitable for the present invention.

The present invention then dries the color filter material. In the present embodiment, after a given amount of time, which determines the filter transmission, the excess material is squeegeed off and the color filter material is dried. Even though a squeegeeing process is used in the present embodiment, those having ordinary skill in the art will no doubt appreciate other methods of removing excess materials.

Figure 2B:
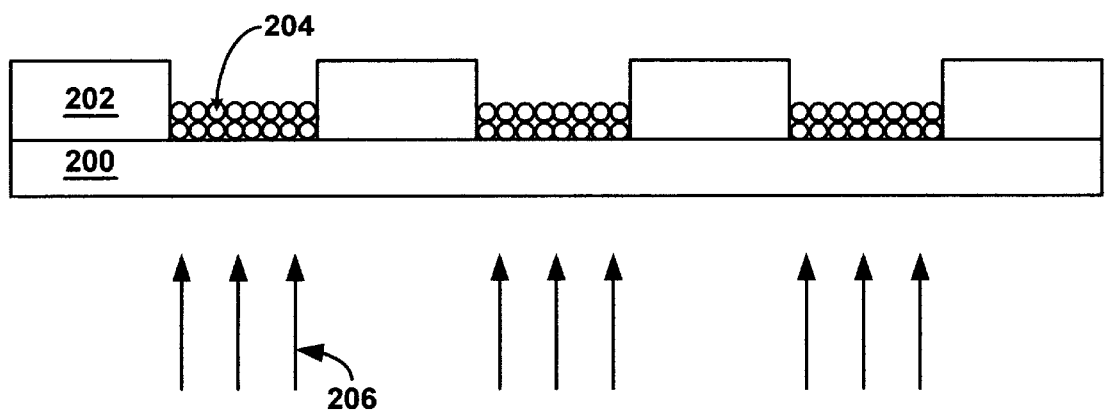
FIG. 2B is a side sectional view of exposure of color pigment crystals within a black matrix structure.

With reference to FIG. 2B, the present embodiment then exposes the layer of the dried color filter material to a visible light 206 from the exterior side of the glass substrate 200. The use of visible light for effecting a cure is well known in the art. However, those skilled in the art will appreciate that other light may be used for exposing the dried color filter material. As mentioned above, the visible light exposure takes place through glass substrate 200 and through a photomask. In the present embodiment, the thickness of glass substrate 200 is about 1.1 mm (e.g., Shott B623 glass). It is well known in the art that a thin glass, such as Shott B623, has excellent visible properties. However, those skilled in the art will appreciate that other transparent materials of differing thickness with excellent visible properties may be suitable to the present invention.

During the exposure process, a photomask is used to enable exposure of predetermined pixels only. In the present embodiment, the photomask is used to expose only the color pigment crystals located in desired color pixels. For instance, the photomask exposes red color pigment crystals disposed within the pixels having a preassigned color of red. Similarly, the photomask enables exposure only of pixels with a preassigned color of green.

The present invention then removes excess layer of the exposed color filter material, leaving a color filter of desired color transmission wavelength disposed on the glass substrate. The excess layer of exposed color filter material is formed on top of pixels having preassigned colors that are different from the color of the color filter material. In the present embodiment, the unwanted layer may be removed by either washing it off or baking it off. Those skilled in the art are readily familiar with these exemplary removal methods. However, they will appreciate that other removal methods may be equally suitable for the present invention.

In the past, conventional methods of creating a color filter within a display structure setting have exposed color filter materials to a visible light from the interior side of the display screen. Specifically, conventional methods did not expose a color filter material through the display screen. Under the conventional methods, the color pigment crystals did not adhere well under this exposure method. This has meant adjusting formulation to prevent rapid exposure.

In contrast, the present embodiment exposes the color filter material through glass substrate 200 as shown in FIG. 2B. In the present embodiment, the dried color material contacting glass substrate 200 is exposed first. As a result, the color pigment crystals 204 solidly adhere to glass substrate 200 during the exposure process.

Figure 2C:
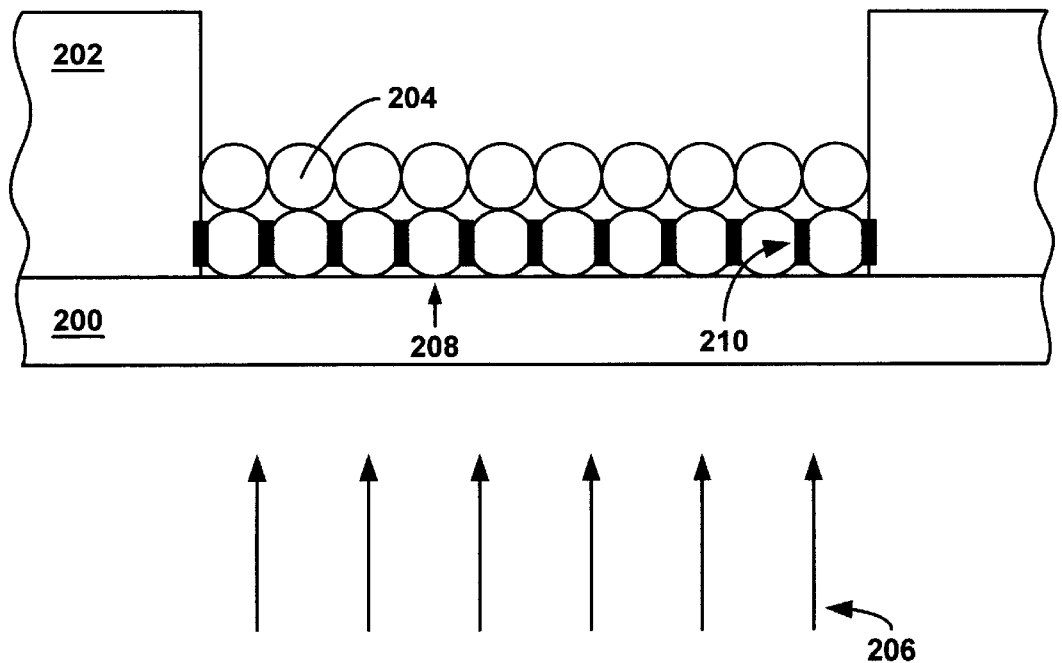
FIG. 2C is an enhanced side sectional view of exposure of color pigment crystals within a black matrix structure.

The exposure process of the present embodiment is generally illustrated in FIG. 2B and more particularly depicted in FIG. 2C. In both figures, color pigment crystals 204 form a layer of color filter on the interior surface of glass substrate 200. Color pigment crystals 204 are exposed to visible light 206. With reference to FIG. 2C, upon being exposed to visible light 206, the color pigment crystals 204 in direct contact with glass substrate 200 contact bond 208 with the surface of glass substrate 200. The color pigment crystals 204 also cross-link, as shown by structure 210, to other adjacent crystals. As a result, color pigment crystals 204 form a more adhesive and coherent layer in the present embodiment.

Furthermore, the present invention advantageously utilizes the black matrix as a built-in mask. As mentioned above, the conventional method of exposing the crystals from the top side of a black matrix required extreme precision in the alignment of a photomask. A misalignment meant curing of unwanted color pigment crystals on top or edges of a black matrix. In contrast, as illustrated in FIG. 2B, visible light 206 exposes color pigment crystals 204 from the bottom side of black matrix 202, i.e. the interior side of glass substrate 200. Hence, the present invention uses black matrix 202 as a natural mask to prevent curing of unwanted color pigment crystals on to top or edges of black matrix. As a result, a minor misalignment of a photomask does not produce curing of color pigment crystals at unwanted areas.

Figure 2D:
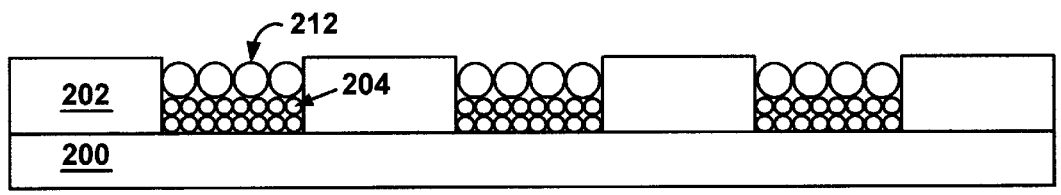
FIG. 2D is a side sectional view of phosphors disposed on top of color pigment crystals within a black matrix structure.

In addition, the present invention has other advantages. In reference to FIG. 2D, the present embodiment shows a layer of phosphors 212 disposed on top of the color pigment crystals. Unlike some conventional phosphors, the phosphors in the present invention need not be coated with color crystals.

Figure 2E:
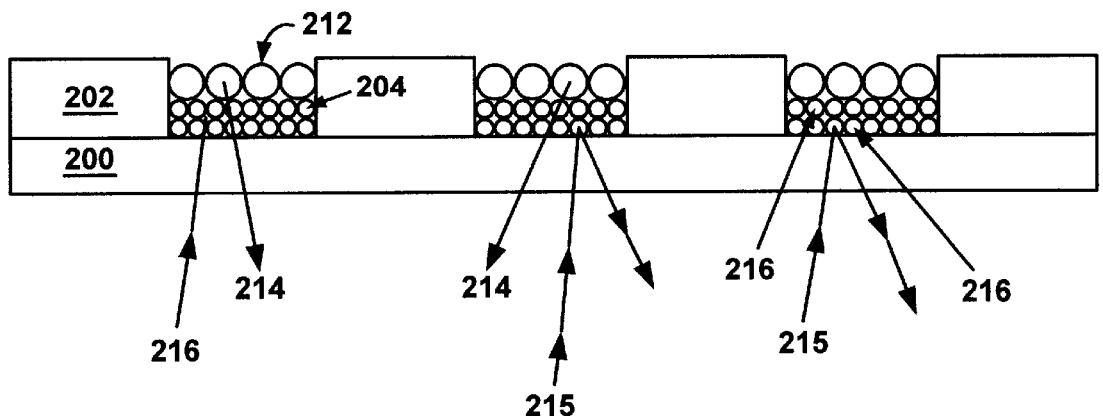
FIG. 2E is a side sectional view of paths of light transmitting through and absorbed by color pigment crystals.

FIG. 2E illustrates how color pigment crystals function as a color filter. Light 216 originating from outside and entering the pixel area is intercepted by color pigment crystals 204. Visible light is usually comprised of all wavelengths in the visible light spectrum. Light 216 having wavelengths different from color pigment crystals 204 is absorbed while light 215 having a similar wavelength to the color pigment crystals 204 is reflected by the filter. Hence, unwanted reflection off the display screen is substantially reduced. On the other hand, light 214 originating from phosphors 212 has a similar wavelength characteristic to the color pigment crystals. As a result, phosphor light is substantially transmitted through the filter to the viewing screen. Thus, the color crystal filter of the present embodiment makes the colors more saturated at the desired transmission wavelength.

Thus, the present invention provides a method for fabricating a color filter on a display screen which improves readability of display screens by reducing reflection of ambient light and by increasing transmission of phosphor light of desired wavelength without reducing generation of light by phosphors in a way that provides a more efficient adhesion of color pigment crystals to the screen display structure while improving precision in curing process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for curing a color filter on a field emission display screen, said method comprising the steps of:
   a) applying a color filter material into pixel regions disposed on the interior surface of a glass substrate of said field emission display screen to form a color filter material layer, said pixel regions defined by a black matrix structure;
   b) drying said color filter material layer; and
   c) exposing said color filter material layer to a light source from the exterior surface of said glass substrate of said field emission display screen such that said color filter material cures and adheres to said interior surface of said glass substrate of said field emission display screen.

2. The method as recited in claim 1 wherein step a) further comprises the step of:
   applying, into said pixel regions disposed on said interior surface of said glass substrate of said field emission display screen, a color filter material comprised of a potassium silicate solution and an inorganic dye material.

3. The method as recited in claim 2, wherein step a) further comprises the step of:
   applying, into said pixel regions disposed on said interior surface of said glass substrate of said field emission display screen a color filter material comprised of:
   5% by volume potassium silicate solution;
   0.2 to 5% by weight a salt dichromate;
   a surfactant;
   a dispersant;
   an emulsifier;
   tetraethylene glycol;
   2.5% by volume a salt acetate buffer; and water.

4. The method as recited in claim 1 wherein step a) further comprises the step of:
   applying a color filter material containing color pigment crystals comprised of the group consisting of cobalt aluminate, iron oxide, and titanium oxide into said pixel regions disposed on said interior surface of said glass substrate of said field emission display screen.

5. The method as recited in claim 1 wherein step c) further comprises exposing said color filter material layer to visible light from the exterior surface of said glass substrate of said field emission display screen such that said pixel defining structure masks portions of said color filter material from said visible light.

6. The method as recited in claim 1 wherein step c) further comprises using a photomask to expose said color filter material layer to visible light from the exterior surface of said glass substrate of said field emission display screen such that only selected pixel regions containing said color filter material are exposed to said visible light.

7. A method for creating a color filter on a field emission display screen having a black matrix structure formed thereon, said black matrix structure defining color sub-pixels, said method comprising the steps of:

a) applying a first color filter material onto the interior side of a glass substrate of said field emission display screen to form a first color filter material layer;

b) drying said first color filter material layer;

c) exposing said first color filter material layer to visible light through the exterior side of said glass substrate of said field emission display screen such that said color filter material layer is cured and bonds to said interior surface of said glass substrate of said field emission display screen;

d) removing excess portions of said first color filter material layer such that said first color material layer remains only in selected corresponding first color sub-pixels; and e) repeating steps a) through for subsequent layers of color filter materials.

8. The method as recited in claim 7 wherein step a) further comprises the step of:

applying, into said pixel regions disposed on said interior surface of said glass substrate of said field emission display screen, a first color filter material comprised of:
5% by volume potassium silicate solution;
0.2 to 5% by weight a salt dichromate;
a surfactant;
a dispersant;
an emulsifier;
tetraethylene glycol;
2.5% by volume a salt acetate buffer; and water.

9. The method as recited in claim 7 wherein step a) further comprises the step of:

applying a first color filter material containing color pigment crystals comprised of the group consisting of cobalt aluminate, iron oxide, and doped titanium oxide into said pixel regions disposed on said interior surface of said glass substrate of said field emission display screen.

10. The method as recited in claim 7 wherein step c) further comprises using a photomask to expose said first color filter material layer to visible light from said exterior surface of said glass substrate of said field emission display screen such that only selected pixel regions containing said first color filter material are exposed to said visible light.

11. A method for creating a color filter on a field emission display screen having a black matrix structure formed thereon, said black matrix structure defining color sub-pixels, said method comprising the steps of:

a) depositing a first color filter material into selected first color sub-pixels disposed the interior side of a glass substrate of said field emission display screen;

b) optionally depositing a second color filter material into selected second color sub-pixels disposed the interior side of a glass substrate of said field emission display screen;

c) optionally depositing a third color filter material into selected third color sub-pixels disposed the interior side of a glass substrate of said field emission display screen;

d) drying said first, second, and third color filter materials;

e) exposing said first, second, and third color filter materials to visible light through the exterior side of said glass substrate of said field emission display screen such that said first, second, and third color filter materials are cured and bonded to said interior surface of said glass substrate of said field emission display screen.

12. The method as recited in claim 11 wherein steps a) through c) further comprise the steps of:

applying a first color filter material containing color pigment crystals comprised of the group consisting of cobalt aluminate, iron oxide, and chromium oxide into said first color sub-pixels disposed on said interior surface of said glass substrate of said field emission display screen;

applying a second color filter material containing color pigment crystals comprised of the group consisting of cobalt aluminate, iron oxide, and doped titanium oxide into said second color sub-pixels disposed on said interior surface of said glass substrate of said field emission display screen; and applying a third color filter material containing color pigment crystals comprised of the group consisting of cobalt aluminate, iron oxide, and doped titanium oxide into said third color sub-pixels disposed on said interior surface of said glass substrate of said field emission display screen.

13. The method as recited in claim 12 wherein step e) further comprises exposing said color filter material layer to visible light from the exterior surface of said glass substrate of said field emission display screen such that said black matrix structure masks unwanted portions of said first, second, and third color filter materials from being exposed to said visible light.

14. The method as recited in claim 11 wherein steps a) through c) comprise the step of spray applying the color filter material on the substrate of the display screen of said field emission display device.

15. The method as recited in claim 11 wherein steps a) through c) comprise the step of screen printing the color filter materials into said subpixels of said field emission display screen using a photo-patterning process.

16. The method as recited in claim 11 wherein steps a) through c) comprise the step of screen printing the color filter material into said subpixels of said field emission display screen without a photo-patterning process.

* * * * *

UNITED STATES PATENT AND TRADEMARK OFFICE
CERTIFICATE OF CORRECTION

PATENT NO. : 6,322,937 B1 Page 1 of 1
DATED : November 27, 2001
INVENTOR(S) : Paul M. Drumm and Bob L. Mackey It is certified that error appears in the above-identified patent and that said Letters Patent is hereby corrected as shown below:

<u>Title,</u>
METHOD FOR CREATING A COLOR FILTER LAYER ON A FLAT PANEL DISPLAY SCREEN STRUCTURE

Signed and Sealed this

Second Day of April, 2002

*Attest:*

JAMES E. ROGAN
*Attesting Officer* *Director of the United States Patent and Trademark Office*